United States Patent [19]
Palmer et al.

[11] Patent Number: 5,442,184
[45] Date of Patent: Aug. 15, 1995

[54] SYSTEM AND METHOD FOR SEMICONDUCTOR PROCESSING USING POLARIZED RADIANT ENERGY

[75] Inventors: Shane R. Palmer, Dallas, Tex.; Gong Chen, Madison, Wis.

[73] Assignee: Texas Instruments Incorporated, Dallas, Tex.

[21] Appl. No.: 165,284

[22] Filed: Dec. 10, 1993

[51] Int. Cl.⁶ .............................. G03B 27/72
[52] U.S. Cl. ................... 250/442.2; 355/71
[58] Field of Search ............ 250/492.2; 355/71

[56] References Cited

U.S. PATENT DOCUMENTS

| | | | |
|---|---|---|---|
| 4,514,082 | 4/1985 | Guegnon et al. | 355/54 |
| 4,819,033 | 4/1989 | Yoshitake et al. | 355/53 |
| 4,970,546 | 11/1990 | Suzuki et al. | 355/53 |
| 5,300,972 | 4/1994 | Kamon | 355/71 |

OTHER PUBLICATIONS

Article, Alfred K. Wong, "Polarization Effects in Mask Transmissions", (1992) SPIE vo. 1674 Optical/Laser Microlithography V pp. 193–200.

Article, Shigeru Aoyama and Tsukasa Yamashita, "Grating Beam Splitting Polarizer Using Multi-Layer Resist Method", (1991) SPIE vol. 1545 International Conference on the Application and Theory of Periodic Structures pp. 241–250.

*Primary Examiner*—Jack I. Berman
*Attorney, Agent, or Firm*—Carlton H. Hoel; Richard L. Donaldson

[57] ABSTRACT

An optical lithography system (10) for exposing a layer (12) of radiation sensitive material on a semiconductor wafer (16) is provided. System (10) comprises a source of polarized radiant energy (18), a mask (20) and a lens (22). Radiant energy from a light source (28) is polarized in a predetermined orientation by polarization filter (30). Polarized radiant energy passes through mask (20) and exposes layer (12) in a predetermined pattern. Actuating member (32) may rotate polarization filter (30) to provide more than one orientation for the polarized radiant energy during a single exposure.

23 Claims, 1 Drawing Sheet

SYSTEM AND METHOD FOR SEMICONDUCTOR PROCESSING USING POLARIZED RADIANT ENERGY

TECHNICAL FIELD OF THE INVENTION

This invention relates to semiconductor processing. More particularly, this invention relates to a system and method for semiconductor processing using polarized radiant energy.

BACKGROUND OF THE INVENTION

The semiconductor industry continually seeks new ways to create more sophisticated circuitry while using less surface area of a semiconductor substrate. To achieve this result, individual circuit elements of a semiconductor device may be fabricated closer together. The minimum space between individual circuit elements may be limited by the degree of contrast that may be produced by lithographic processes.

Lithography generally involves placing a radiation sensitive material (sometimes referred to as "photoresist" or "resist") on an oxide film. Typically, the resist is radiated through a mask placed over the resist by lithography techniques such as photolithography, electron beam lithography or x-ray lithography. The mask may be a piece of glass having chrome or another appropriate metal deposited on the mask in a predetermined pattern. The glass area between adjacent chrome areas may be referred to as "slits". The resist reacts chemically in the exposed areas of the mask depending upon the choice of the chemical system. The semiconductor substrate may thereby be further processed in the areas exposed by such lithographic techniques.

The width of slits of a mask may be decreased to allow fabrication of smaller individual circuit elements. Additionally, the width of the slits of a mask may be decreased to fabricate individual circuit elements closer together. Narrower slits allow less ultraviolet light to be transmitted through the mask toward the resist. As the width of a slit approaches the wavelength of the incident ultraviolet light, the ultraviolet light may cease to be transmitted through the slit. With narrower slits, it may be necessary to expose the resist for longer periods of time in order to adequately expose the resist. One particular problem with prior systems is that narrower slits of the mask result in low contrast on the resist layer.

SUMMARY OF THE INVENTION

In accordance with the present invention, a system and method for semiconductor processing using polarized radiant energy is provided which substantially eliminates or reduces disadvantages and problems associated with prior systems and methods. More particularly, one embodiment of the present invention provides an optical lithography system for exposing a layer of radiation sensitive material on a semiconductor wafer. The system comprises a source of polarized radiant energy, a mask, and a lens. The radiant energy is polarized in a predetermined orientation. A mask is positioned between the source of radiant energy and the wafer such that the polarized radiant energy also passes through the mask. Additionally, the polarized radiant energy passes through a lens that focuses the polarized radiant energy on the wafer to expose the layer of radiation sensitive material in a predetermined pattern.

A technical advantage of the present invention inheres in the fact that it uses radiant energy that is polarized in a predetermined orientation to transmit radiant energy through a narrow slit in a mask with little loss in intensity. The system of the present invention allows radiant energy to be transmitted through a slit even if the width of the slit is on the order of the wavelength of the incident radiant energy. The system minimizes scattering and absorption of the radiant energy at the mask. Therefore, a layer of radiation sensitive material may be exposed with greater contrast allowing individual devices to be fabricated closer together.

It is another technical advantage of the present invention to provide a system with a rotatable polarization filter. The filter may be rotated to vary the orientation of the polarized radiant energy during a single exposure of a layer of radiation sensitive material. This allows greater contrast in more than one direction.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
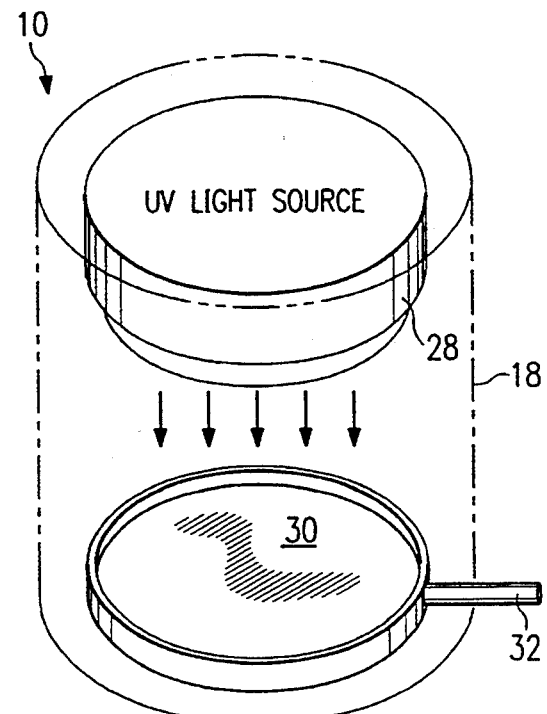
FIG. 1 illustrates an optical lithography system for exposing a layer of radiation sensitive material on a semiconductor wafer constructed according to the teachings of the present invention.

FIG. 1 illustrates an optical lithography system indicated generally at 10 for exposing a layer of radiation sensitive material 12 having a surface 14 on a semiconductor wafer 16. Layer 12 may comprise, for example, a layer of photoresist material. System 10 utilizes radiant energy polarized in a predetermined orientation to obtain a high degree of contrast in the exposure of layer 12 by minimizing lost energy due to scattering and absorption. Layer 12 may be exposed by system 10 with sharp contrast for features that are separated by a distance on the order of the wavelength of the radiant energy used to expose layer 12.

System 10 comprises a source 18 of polarized radiant energy, a mask 20, and a lens 22. Mask 20 may be positioned between source 18 and lens 22. Mask 20 may comprise a sheet of glass having a pattern of chrome material 24 formed on surface 26 of mask 20. System 10 is designed to achieve a high degree of contrast in layer 12 when the individual elements of chrome pattern 24 are separated by a distance on the order of the wavelength of the radiant energy produced by source 18. Lens 22 may comprise an appropriate lens for focusing the polarized radiant energy from source 18 on surface 14 of layer 12.

Source 18 may comprise, for example, light source 28, polarization filter 30 and actuating member 32. Light source 28 may comprise, for example, a source of ultraviolet light or other appropriate radiant energy for exposing layer 12. Polarization filter 30 may be positioned between light source 28 and mask 20. Polarization filter 30 may be oriented in a plane parallel to the plane of surface 14 of layer 12. Polarization filter 30 may be rotated within a plane parallel to layer 14 by actuation member 32. Source 18 may provide variably polarized radiant energy to layer 12 during a single exposure. This allows sharp contrast for individual circuit elements that are close together in more than one orientation. For example, some circuit elements may be separated by a slit oriented along the X-axis shown in FIG. 1 and other circuit elements may be separated by a slit oriented along the Y-axis shown in FIG. 1.

Polarization filter 30 may comprise, for example, a linear polarization filter. For example, polarization filter 30 may comprise a dichroic filter, a half-wave plate filter, or a bi-refringent filter. Alternatively, polarization filter 30 may comprise a circular polarization filter or an elliptical polarization filter. Polarization filter 30 may, for example, polarize radiation energy in a plane perpendicular to layer 12.

In operation, semiconductor wafer 16 is positioned within system 10. An appropriate mask 20 is placed between source 18 and lens 22. Polarization filter 30 is adjusted by actuating member 32 such that source 18 provides ultraviolet light polarized in an appropriate orientation for mask 20. Layer 12 is exposed by ultraviolet light from light source 28 through polarization filter 30, mask 20 and lens 22. Additionally, polarization filter 30 may be adjusted to provide a second polarization during the exposure of layer 12. For example, polarization filter 30 may be oriented to provide ultraviolet light polarized in the X-direction for the first half of the exposure time. Additionally, polarization filter 30 may be oriented to provide ultraviolet light polarized in the Y-direction during the remaining portion of the exposure. The choice as to the direction of polarization and length of time for each polarization may be determined for a particular mask 20 using a program titled EMFLEX produced and commercially available from by Weidlinger Associates of Los Altos, Calif.

Figure 2:
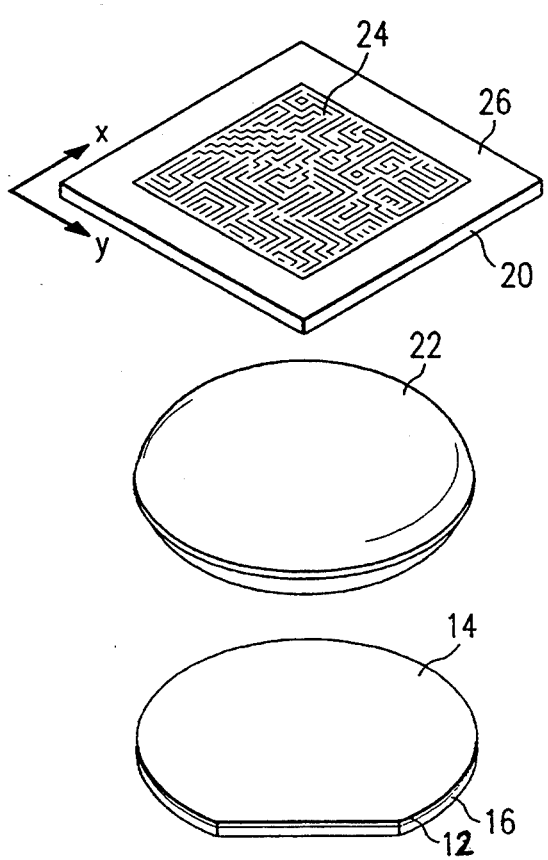
FIG. 2 illustrates another embodiment of a polarization filter for use with the optical lithography system of FIG. 1.
Figure 2:
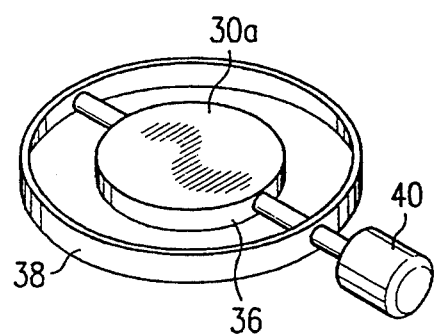

FIG. 2 illustrates an alternative polarization filter system indicated generally at 34. Polarization filter system 34 may comprise, for example, a polarization filter 30a having an edge 36, a track 38, and a motor 40. Edge 36 of polarization filter 30a may be coupled to track 38. Motor 40 may be coupled to track 38. Motor 40 may cause polarization filer 30a to rotate in track 38. Polarization filter system 34 may replace polarization filter 30 and actuating member 32 in system 10.

In operation, polarization filter assembly 34 may provide multiple orientations of polarization filter 30a during a single exposure of layer 12. After a predetermined period of time during an exposure of layer 12, motor 40 may cause polarization filter 30a to rotate thereby providing a second polarization for exposing layer 12.

Although the present invention has been described in detail, it should be understood that various changes, substitutions and alterations can be made hereto without departing from the spirit and scope of the invention as defined by the appended claims. For example, actuating member 32 may be replaced with other electromechanical devices operable to rotate polarization filter 30.

What is claimed is:

1. An optical lithography system for exposing a layer of radiation sensitive material on a semiconductor wafer, said system comprising:
   a source of polarized radiant energy, said radiant energy polarized in a predetermined orientation;
   a mask positionable between said source of radiant energy and the wafer, said mask including a plurality of slits, said slits having a length greater than the wavelength of said polarized radiant energy, said polarized radiant energy being positioned so that the direction of polarization of said polarized radiant energy is aligned with at least one of said slits; and
   a lens for focusing the polarized radiant energy transmitted through the mask on the wafer to expose the radiation sensitive material in a predetermined pattern.

2. The system of claim 1, wherein said source of polarized radiant energy comprises:
   a source of uniform, unpolarized ultraviolet light; and
   a polarization filter positionable between said light source and said mask such that said unpolarized light is polarized in a predetermined orientation.

3. The system of claim 1, wherein said source of polarized radiation energy comprises:
   a source of uniform, unpolarized ultraviolet light;
   a polarization filter positionable between said light source and said mask for polarizing said unpolarized light; and
   an actuating member coupled to said filter for rotating said filter to vary the polarization of said polarized light.

4. The system of claim 1, wherein said source of polarized radiation energy comprises:
   a source of uniform, unpolarized ultraviolet light;
   a polarization filter having an edge, said filter positionable between said light source and said mask for polarizing said unpolarized light;
   a track coupled to said edge of said polarization filter; and
   a motor coupled to said track for rotating said polarization filter to vary the polarization of said polarized light.

5. The system of claim 1, wherein said source of polarized radiation energy comprises:
   a source of uniform, unpolarized ultraviolet light; and
   a dichroic polarization filter positionable between said light source and said mask for polarizing said unpolarized light.

6. The system of claim 1, wherein said source of polarized radiation energy comprises:
   a source of uniform, unpolarized ultraviolet light; and
   a half-wave plate polarization filter positionable between said light source and said mask for polarizing said unpolarized light.

7. The system of claim 1, wherein said source of polarized radiation energy comprises:
   a source of uniform, unpolarized ultraviolet light; and
   a polarization filter having a bi-refringent material, said filter positionable between said light source and said mask for polarizing said unpolarized light.

8. The system of claim 1, wherein said source of polarized radiation energy comprises:
   a source of uniform, unpolarized ultraviolet light; and
   a circular polarization filter positionable between said light source and said mask for polarizing said unpolarized light.

9. The system of claim 1, wherein said source of polarized radiation energy comprises:
   a source of uniform, unpolarized ultraviolet light; and
   an elliptical polarization filter positionable between said light source and said mask for polarizing said unpolarized light.

10. An optical lithography system as in claim 1, wherein said slits are arranged so that the length of said slits are in parallel.

11. An optical lithography system as in claim 1, wherein said slits include a first subset of said slits arranged so that the length of said first subset of slits are in parallel with each other and a second subset of slits arranged so that the length of said second subset of slits are in parallel with each other and not in parallel with said first subset of slits; and an actuator for changing the polarization of said source of polarized radiant energy to allow the direction of polarization of said source of polarized radiant energy to be aligned with the length of said first subset of slits and then said second subset of slits.

12. An optical lithography system for exposing a layer of radiation sensitive material on a semiconductor wafer, comprising:

a source of uniform, unpolarized ultraviolet light;

a polarization filter positionable between said light source and said mask such that said unpolarized light is polarized in a predetermined orientation to provide polarized light;

a mask positionable between said light source and the wafer, said mask including a plurality of slits, said slits having a length greater than the wavelength of said polarized light, said polarized light being positioned so that the direction of polarization of said polarized light is aligned with at least one of said slits; and a lens for focusing said polarized light transmitted through the mask on the wafer to expose predetermined portions of the photoresist.

13. The system of claim 12, wherein said polarization filter further comprises an actuating member coupled to said filter for rotating said filter to vary the polarization of said polarized light.

14. The system of claim 12, wherein said polarization filter further comprises an edge, said system further comprising a track coupled to said edge of said polarization filter and a motor coupled to said track for rotating said polarization filter to vary the polarization of said polarized light.

15. The system of claim 12, wherein said polarization filter comprises a dichroic polarization filter.

16. The system of claim 12, wherein said polarization filter comprises a half-wave plate polarization filter.

17. The system of claim 12, wherein said polarization filter comprises a polarization filter having a bi-refringent material.

18. The system of claim 12, wherein said polarization filter comprises a circular polarization filter.

19. The system of claim 12, wherein said polarization filter comprises an elliptical polarization filter.

20. An optical lithography system as in claim 12, wherein said slits are arranged so that the length of said slits are in parallel.

21. An optical lithography system as in claim 12, wherein said slits include a first subset of said slits arranged so that the length of said first subset of slits are in parallel with each other and a second subset of slits arranged so that the length of said second subset of slits are in parallel with each other and not in parallel with said first subset of slits; and an actuator for changing the polarization of said source of polarized radiant energy to allow the direction of polarization of said source of polarized radiant energy to be aligned with the length of said first subset of slits and then said second subset of slits.

22. A method for exposing a layer of radiation sensitive material on a semiconductor wafer, comprising the steps of:

positioning a mask between a source of a radiant energy and the wafer, said mask including a plurality of slit, said slits having a length greater than the wavelength of said radiant energy;

positioning a polarization filter between the source of radiant energy and the mask such that unpolarized radiant energy passing through the filter is polarized in a predetermined orientation to provide polarized radiant energy, said polarized radiant energy being positioned so that the direction of polarization of said polarized light is aligned with at least one of said slits; and focusing the polarized radiant energy transmitted through the mask on the wafer using a lens to expose predetermined portions of the layer of radiation sensitive material.

23. The method of claim 22, and further comprising the step of rotating the polarization filter during the exposure of the layer of radiation sensitive material to align said orientation of polarization of said polarized radiant energy to all of said slits.

* * * * *